United States Patent
Rahim et al.

(10) Patent No.: US 8,633,731 B1
(45) Date of Patent: Jan. 21, 2014

(54) PROGRAMMABLE INTEGRATED CIRCUIT WITH THIN-OXIDE PASSGATES

(75) Inventors: Irfan Rahim, Milpitas, CA (US); Mao Du, Cupertino, CA (US); Jeffrey Xiaoqi Tung, Milpitas, CA (US); Jun Liu, Milpitas, CA (US); Qi Xiang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 62 days.

(21) Appl. No.: 13/206,401

(22) Filed: Aug. 9, 2011

(51) Int. Cl.
*G06F 7/38* (2006.01)

(52) U.S. Cl.
USPC ............................................. 326/40; 326/113

(58) Field of Classification Search
USPC .......................................... 326/40, 112–113
See application file for complete search history.

(56) References Cited

U.S. PATENT DOCUMENTS

| | | | |
|---|---|---|---|
| 5,122,846 A | 6/1992 | Haken | |
| 5,642,315 A | 6/1997 | Yamaguchi | |
| 5,801,551 A | 9/1998 | Lin | |
| 6,025,737 A | 2/2000 | Patel et al. | |
| 6,232,893 B1 | 5/2001 | Cliff et al. | |
| 6,335,893 B1 | 1/2002 | Tanaka et al. | |
| 6,433,585 B1 | 8/2002 | Patel et al. | |
| 6,519,191 B1 | 2/2003 | Morishita | |
| 6,724,222 B2 | 4/2004 | Patel et al. | |
| 6,777,978 B2 | 8/2004 | Hart et al. | |
| 6,795,332 B2 | 9/2004 | Yamaoka et al. | |
| 6,897,679 B2 | 5/2005 | Cliff et al. | |
| 6,952,114 B2 * | 10/2005 | Turner | 326/38 |
| 7,042,756 B2 * | 5/2006 | Madurawe | 365/154 |
| 7,180,334 B2 | 2/2007 | Starr | |
| 7,277,351 B2 * | 10/2007 | Liu et al. | 365/226 |
| 7,355,454 B2 * | 4/2008 | Papaefthymiou et al. | 326/93 |
| 7,411,853 B2 | 8/2008 | Liu et al. | |
| 7,430,148 B2 | 9/2008 | Liu et al. | |
| 7,463,057 B1 * | 12/2008 | Rahim et al. | 326/38 |
| 7,486,111 B2 * | 2/2009 | Madurawe | 326/38 |
| 7,573,317 B2 | 8/2009 | Lewis et al. | |
| 7,635,988 B2 * | 12/2009 | Madurawe | 326/40 |
| 7,800,402 B1 | 9/2010 | Rahim et al. | |
| 7,969,759 B1 * | 6/2011 | Thummalapally et al. | 365/49.11 |
| 7,986,547 B2 * | 7/2011 | Hirabayashi | 365/156 |
| 8,072,237 B1 * | 12/2011 | Rahim et al. | 326/39 |
| 2002/0000834 A1 * | 1/2002 | Ooishi | 326/113 |
| 2006/0237784 A1 * | 10/2006 | Rahim et al. | 257/333 |
| 2008/0181034 A1 * | 7/2008 | Hunter et al. | 365/200 |
| 2011/0068400 A1 * | 3/2011 | Wang et al. | 257/347 |

OTHER PUBLICATIONS

Rahim et al. U.S. Appl. No. 12/478,713, filed Jun. 4, 2009.
Rahim et al. U.S. Appl. No. 12/345,560, filed Dec. 29, 2008.

* cited by examiner

*Primary Examiner* — Jason M Crawford
(74) *Attorney, Agent, or Firm* — Treyz Law Group; G. Victor Treyz; Chih-Yun Wu

(57) ABSTRACT

Integrated circuits such as programmable integrated circuits may have configuration random-access memory elements. The configuration random-access memory elements may be loaded with configuration data to customize programmable circuitry on the integrated circuits. Each memory element may have a bistable element that is powered using a positive power supply voltage and a negative power supply voltage. Programmable transistors in the programmable circuitry may have gates coupled to outputs of the bistable elements. The programmable transistors may have gate insulators that are thinner than gate insulators in the transistors of the bistable elements and may have threshold voltages of about zero volts. During operation, some of the configuration random-access memory elements may supply negative voltages to their associated programmable transistors so that the programmable transistors are provided with gate-source voltages of less than zero volts.

21 Claims, 7 Drawing Sheets

| TRANSISTOR(S) | OXIDE THICKNESS |
|---|---|
| BISTABLE ELEMENT TRANSISTORS | TOXM |
| PASSGATE | TOXT < TOXM |
| WRITE ADDRESS | TOXM OR TOXT |
| READ ADDRESS | TOXM OR TOXT |
| CLEAR | TOXM OR TOXT |
| READ BUFFER | TOXM |

FIG. 7

PROGRAMMABLE INTEGRATED CIRCUIT WITH THIN-OXIDE PASSGATES

BACKGROUND

Integrated circuits often contain volatile memory elements. In programmable integrated circuits, volatile memory elements can be used to store configuration data. This type of memory is sometimes referred to as configuration random-access memory (CRAM).

Programmable integrated circuits can be customized in relatively small batches to implement a desired logic design. In a typical scenario, a programmable integrated circuit manufacturer designs and manufactures uncustomized programmable integrated circuits in advance. A logic designer may then use a logic design system to design a custom logic circuit. The logic design system uses information on the hardware capabilities of the manufacturer's programmable integrated circuit to help the designer implement the logic circuit using the resources available on a given programmable integrated circuit.

The logic design system creates configuration data based on the logic designer's custom design. When the configuration data is loaded into the configuration random-access memory elements of one of the programmable integrated circuits, it programs the circuitry of that programmable integrated circuit so that the programmable integrated circuit implements the designer's logic circuit. The use of programmable integrated circuits can significantly reduce the amount of effort required to implement a desired integrated circuit design.

Programmable circuits on a programmable integrated circuit contain pass gates that are controlled by corresponding configuration random-access memory elements. The value of the output from a configuration random-access memory element is used to control whether an associated pass gate is turned on or off, thereby configuring programmable circuitry that contains the pass gate.

SUMMARY

The pass gates in a programmable integrated circuit may be provided with thin gate insulator. The thickness of the gate insulator in the pass gates may, for example, be less than the thickness of transistors in the bistable storage element portion of an associated memory element.

An array of memory elements may serve as configuration random-access memory for customizing programmable circuitry on the programmable integrated circuit. The configuration random-access memory elements may be loaded with configuration data. Each memory element may have a bistable element that is powered using a positive power supply voltage and a negative power supply voltage. When loaded with a logic value such as a logic "1," the memory element may supply an output at the positive power supply voltage. When loaded with a complementary logic value (i.e., a logic "0"), the memory element may supply an output at the negative power supply voltage.

Programmable transistors in the programmable circuitry may have gates coupled to outputs of the bistable elements. The programmable transistors may have gate insulators that are thinner than gate insulators in the transistors of the bistable elements and may have threshold voltages of about zero volts. During operation, some of the configuration random-access memory elements may supply negative voltages to their associated programmable transistors so that the programmable transistors are provided with gate-source voltages Vgs of less than zero volts, reducing leakage current.

Further features of the invention, its nature and various advantages will be more apparent from the accompanying drawings and the following detailed description of the preferred embodiments.

BRIEF DESCRIPTION OF THE DRAWINGS

FIG. 7 is a table listing illustrative transistors that may be used in a random-access memory element and associated programmable circuitry and listing corresponding illustrative gate insulator thicknesses for the transistors in accordance with an embodiment of the present invention.

DETAILED DESCRIPTION

Figure 1:
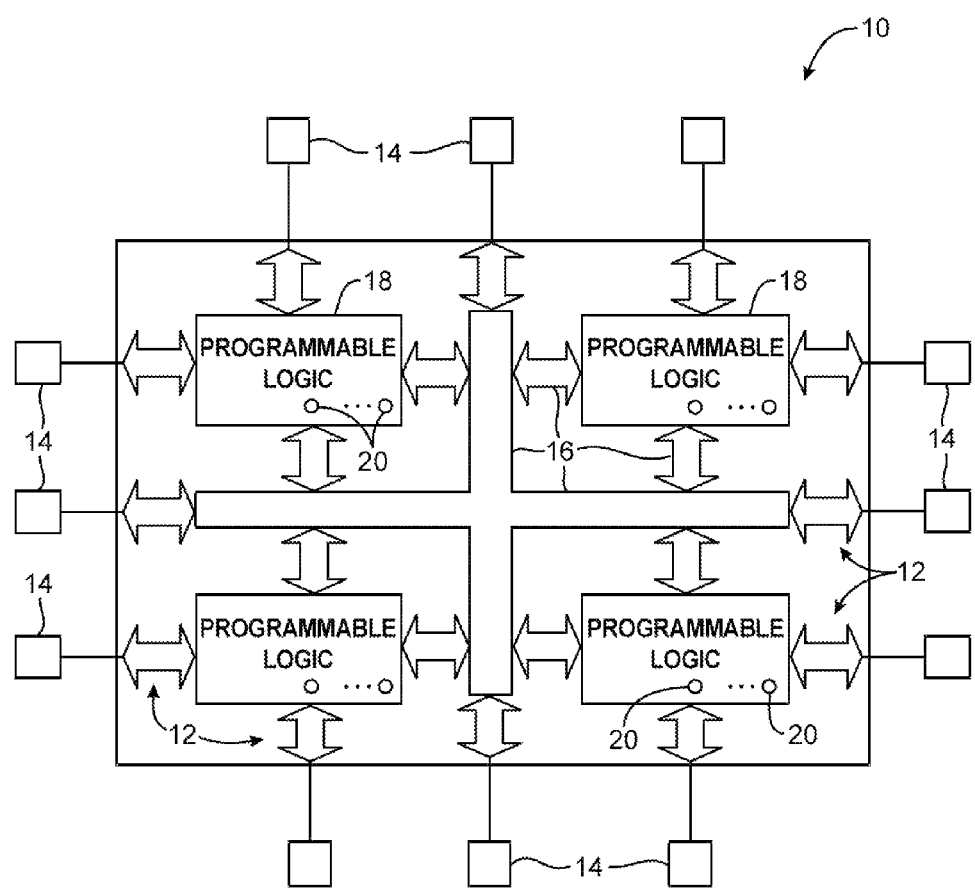
FIG. 1 is a diagram of an illustrative integrated circuit such as a programmable integrated circuit that may be provided with programmable memory elements and pass transistors in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

Figure 2:
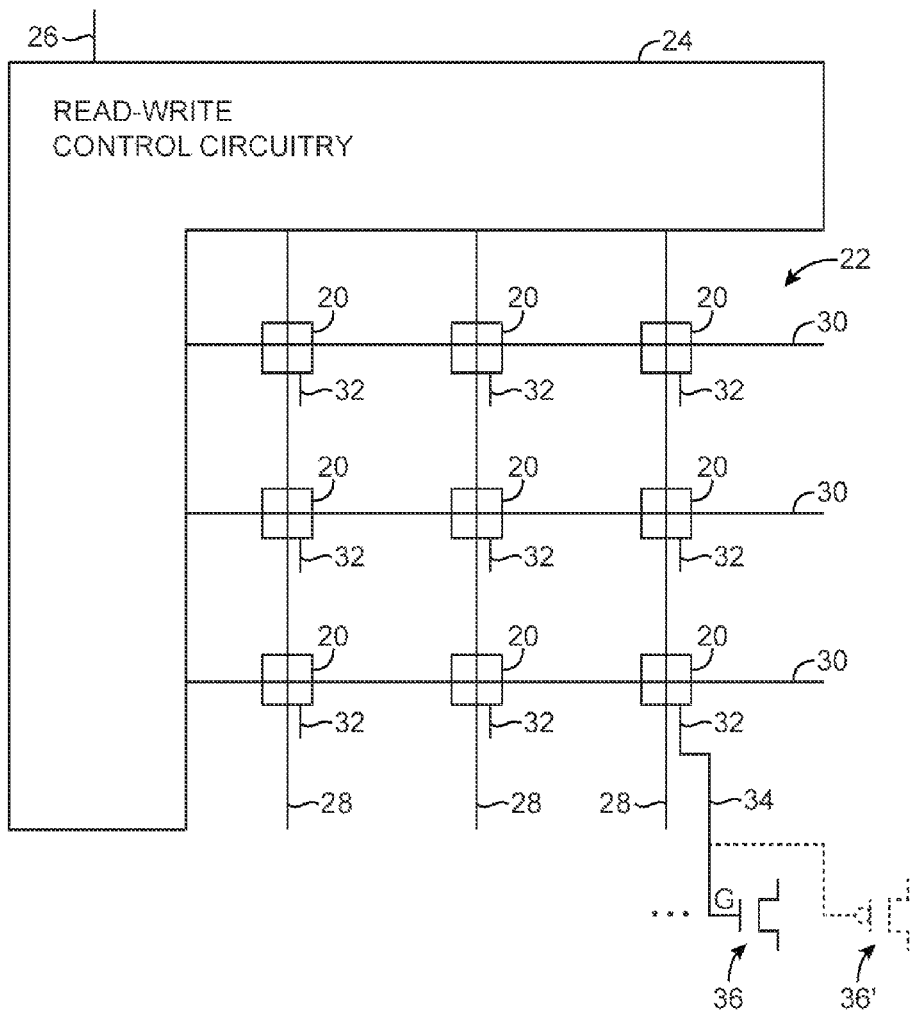
FIG. 2 is a diagram of an array of configuration random-access memory elements and at least one associated programmable transistor that serves as a pass gate in accordance with an embodiment of the present invention.

Horizontal and vertical conductive lines and associated control circuitry may be used to write data into the memory elements and may be used to read data from the memory elements. An illustrative arrangement that allows data to be written into and read from an array of memory elements is shown in FIG. 2. Illustrative array 22 of FIG. 2 has memory elements 20. Memory elements 20 may be volatile memory elements such as CRAM cells. Each memory element may have a corresponding output 32 with which a corresponding static output signal may be applied to the gate of a corresponding programmable transistor. For example, a path such as path 34 may be used to apply an output signal from the output 32 of a memory element 20 to a gate G of a corresponding programmable transistor (pass gate) such as pass gate 36. The programmable transistor may be an n-channel metal-oxide-semiconductor transistor such as transistor 36 of FIG. 2 or may be a p-channel metal-oxide-semiconductor transistor (see illustrative pass gate 36' of FIG. 2).

The arrangement of FIG. 2 has a 3×3 array 22 of memory elements 20. Device 10 may, if desired have more rows and columns (e.g., hundreds or thousands of rows and columns). A 3×3 array is used in FIG. 2 as an example.

Memory elements 20 may be powered using power supply voltages such as a first power supply voltage Vcc and a second power supply voltage Vss. Power supply voltage Vcc may be, for example, a positive power supply voltage. Power supply voltage Vss may be, for example, a negative power supply voltage (e.g., a voltage Vss that has a value of less than that of a zero-volt ground voltage). The zero-volt ground voltage may be used in powering circuitry elsewhere on programmable integrated circuit 10.

Examples of suitable voltage levels that may be used for positive power supply voltage Vcc are voltages in the range of 1.1 volts (e.g., about 0.9 to 1.3 volts, etc.). Examples of suitable voltage levels that may be used for negative power supply voltage Vss are voltages in the range of about −0.2 volts (e.g., about −0.35 to −0.05 volts, etc.). Other voltage levels may be used to form power supply voltages Vcc and Vss, if desired. The use of voltages of about 1.1 volts and −0.2 volts are merely examples.

Read-write control circuitry 24 may obtain data to be loaded into array 22 via path 26. Data that has been read from array 22 may be provided to path 26 from memory elements 20 by read-write control circuitry 24.

Control signals on one or more control lines 30 may be used to control reading and writing operations. For example, during writing and reading operations, signals on address lines in lines 30 (sometimes referred to as word lines) may be asserted to control associated address transistors. If desired, control lines 30 may include clear lines. A clear signal may be asserted on the clear lines when it is desired to clear the contents of the memory elements 20 in array 22 (e.g., when it is desired to clear all of the memory elements in a block of memory elements simultaneously).

Data lines 28 (sometimes referred to as bit lines) may be used in conveying data from read-write control circuitry 24 to memory elements 20 during data loading operations. Data lines 28 may also be used in conveying data from memory elements 20 to read-write control circuitry 24 during data reading operations. The memory elements that are selected during reading and writing operations may be controlled by the address lines (lines 30).

There may be any suitable number of address lines and data lines associated with each memory element 20. For example, each memory element (i.e., each row of memory elements) may be associated with a single address line that is used for controlling both reading and writing operations or may be associated with a write address line for use during write operations and a read address lines for use during read operations. One data line may be associated with each memory element (i.e., each column of memory elements) or a pair of complementary data lines may be associated with each memory element (as examples).

Figure 3:
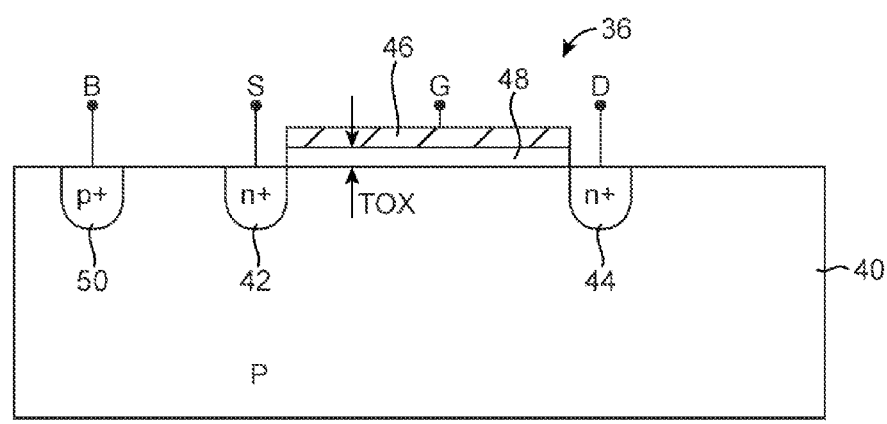
FIG. 3 is a cross-sectional side view of an illustrative programmable transistor in accordance with an embodiment of the present invention.

Programmable transistors such as programmable transistor 36 of FIG. 2 may be formed using metal-oxide-semiconductor (MOS) technology. A cross-sectional side view of an illustrative metal-oxide-semiconductor field effect transistor (MOSFET) of the type that may be used in forming transistors such as transistor 36 of FIG. 2 is shown in FIG. 3. As shown in FIG. 3, transistor 36 may be formed from a semiconductor substrate such as semiconductor substrate 40. Semiconductor substrate 40 may be, for example, a silicon substrate. Doped regions 42 may be used in forming source-drain terminals for transistor 36 (i.e., source terminal S and drain terminal D). A doped region such as doped region 50 may be used to form a body terminal B for transistor 36.

Gate terminal G of transistor 36 may be formed from a gate conductor (conductor 46) on a gate insulator (gate insulator 48). Gate conductor 46 may be formed from metal, doped polysilicon, or other suitable conductive materials. Gate insulator 48 (sometimes referred to as a gate oxide layer) may be formed from a layer of silicon oxide, a high-K dielectric (e.g., a hafnium-based oxide), or other suitable insulating material. The thickness TOX of layer 48 may be, for example, less than 100 angstroms (e.g., 30 angstroms or less, 20 angstroms or less, 15 angstroms or less, etc.). In the example of FIG. 3, transistor 36 is an n-channel metal-oxide-semiconductor (NMOS) field-effect transistor in which source-drain doped regions 42 are doped n+, substrate 40 is a p-type substrate, and body terminal B is formed from a region 50 that is doped p+. If desired, programmable transistors in device 10 may include p-channel metal-oxide-semiconductor transistors.

Figure 4:
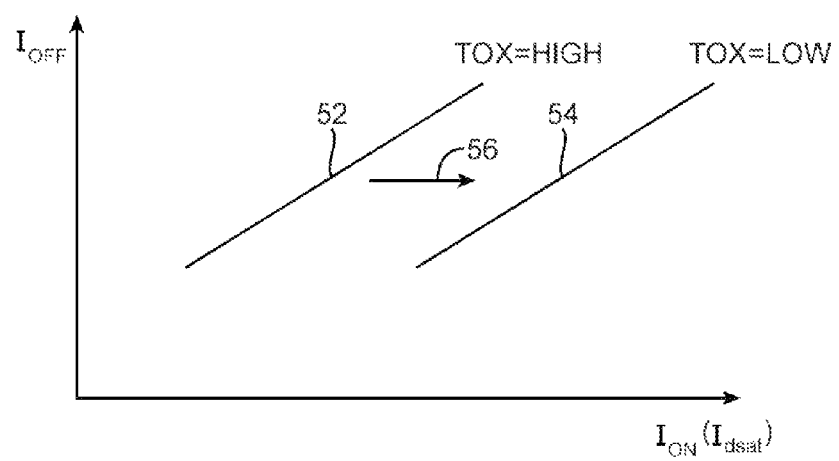
FIG. 4 is a graph showing how transistor Ion/Ioff performance tends to increase with decreasing gate oxide thickness in accordance with an embodiment of the present invention.

It is desirable for transistors such as transistor 36 to exhibit good performance, particularly when transistors such as transistor 36 are used in critical (delay-sensitive) paths within a circuit design. Good performance can be obtained by using a relatively thin oxide thickness TOX for the gate of transistor 36. FIG. 4 is a graph showing how the parameter Ion/Ioff, for transistors such as transistor 36, tends to improve as oxide thickness Tox is reduced. If Tox is relatively large (curve 52), Ion/Ioff may be low. Reducing oxide thickness (illustrated by arrow 56) may result in improved Ion/Ioff values (curve 54) for a given operating voltage. The oxide thickness for transistor 36 may be, as an example, about 12-14 angstroms or other suitable thickness.

To maximize the value of Ion, transistor 36 may be turned on using a gate voltage of 1.1 volts or other suitable Vcc value. This value may be equal to the positive power supply voltage used in powering memory elements 20 and logic circuitry on device 10 (i.e., the same positive power supply voltage Vcc may be used in powering memory elements 20 and in powering logic circuitry on device 10).

To maximize the value of Ion, Vcc is preferably pushed to the highest value permitted by gate oxide reliability considerations on integrated circuit 10 (i.e., the highest value possible while ensuring that the gate oxide layer exhibits satisfactory reliability).

The value of Ion may be further enhanced by ensuring that transistor 36 has a relatively low threshold voltage VT. The use of a low threshold voltage VT for transistor 36 may also help to reduce the body effect in transistor 36. The threshold voltage VT for transistor 36 may be adjusted by adjusting the doping of substrate 40 adjacent to the channel region under the gate of transistor 36 using doping implants. With one suitable arrangement, which is sometimes described herein as an example, Vt may be set to a value of zero volts (i.e., Vt may be equal to 0 volts +/−50 mV, or 0 volts +/−100 mV, may be less than 100 mV, may be less than 50 mV, etc.).

To ensure that programmable transistors in integrated circuit 10 do not exhibit excessive leakage currents, it may be desirable to use a negative Vgs (gate-to-source voltage) when turning off the programmable transistors. For example, the voltage that is applied to transistor 36 (voltage Vss) may be less than −0.1 volts, about −0.2 volts, less than −0.2 volts, in the range of −0.05 to −0.35 volts, in the range of −0.1 to −0.3 volts, in the range of −0.15 to −0.25 volts, or other suitable value.

With this type of configuration, each memory element 20 may supply a positive voltage (e.g., a Vcc value of about 1.1 volts in this example) when it is desired to turn on transistor 36 and may supply a negative voltage (e.g., a Vss value of −0.2 volts or other suitable negative voltage) when it is desired to turn off transistor 36.

To ensure that the transistors in memory element 20 such as the transistors that make up the bistable element portion of memory element 20 operate reliably, it may be desirable to form these transistors using oxide thicknesses that are thicker than those used for transistor 36. If, for example, the oxide thickness for transistor 36 is about 13 angstroms (as an example) the oxide thickness for at least the bistable element transistors in the memory element 20 that controls transistor 36 may be about 22 angstroms (e.g. about 15-30 angstroms, about 18 to 26 angstroms, etc.).

The use of thicker-oxide transistors in the bistable element portion of memory element 20 may allow memory element 20 to operate reliably, even when subjected to a relatively large range of voltages. For example, memory element 20 may operate reliably even when powered using a positive power supply voltage of 1.1 volts and a negative power supply voltage of −0.2 volts (a 1.3 volt swing). The total swing of the bistable element is generally limited by oxide reliability limits.

Figure 5:
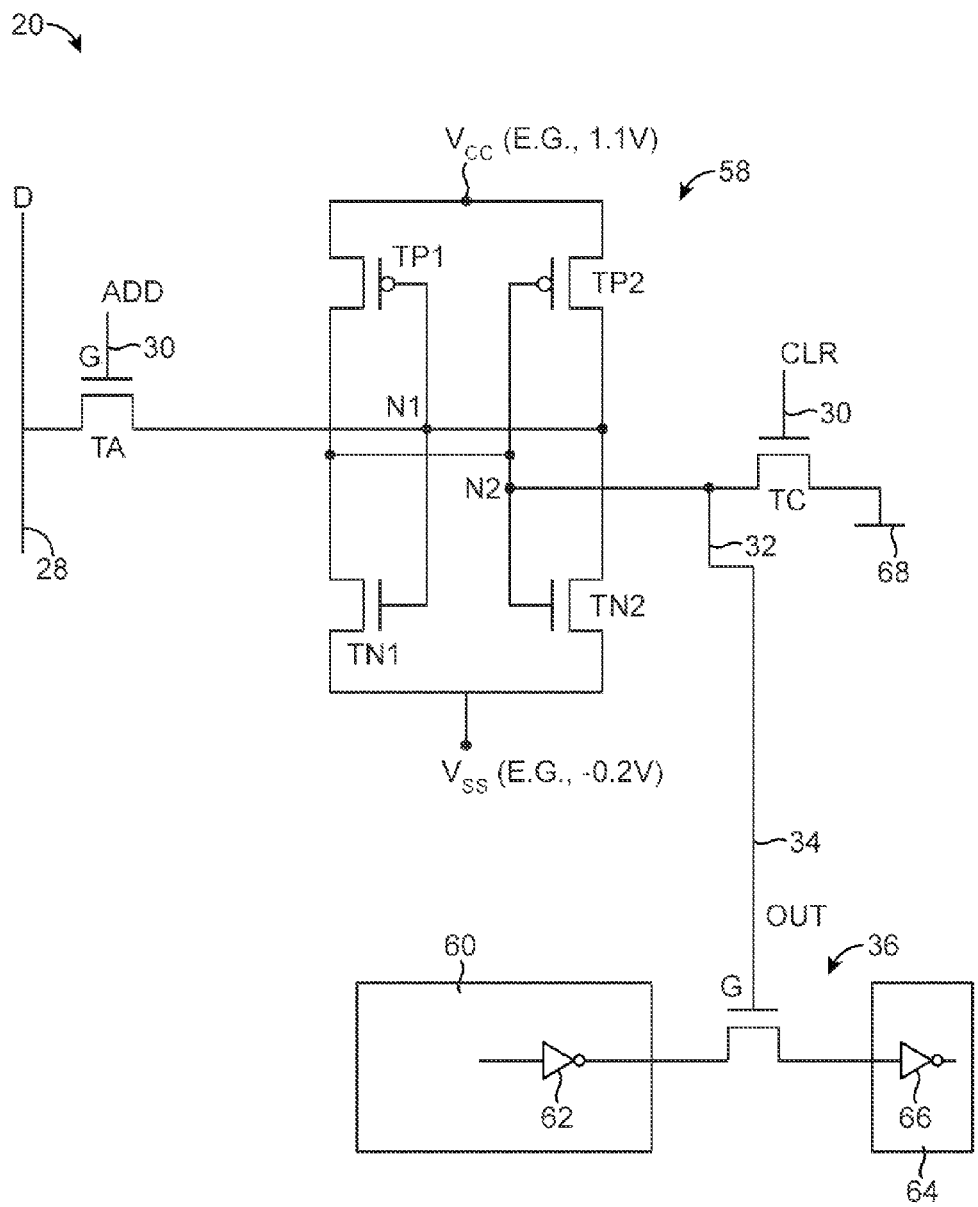
FIG. 5 is a circuit diagram of an illustrative random-access memory element based on a six-transistor design and associated programmable circuitry including a programmable transistor in accordance with an embodiment of the present invention.

Illustrative circuitry that may be used in implementing memory elements 20 and programmable logic circuitry 18 in programmable integrated circuit 10 is shown in FIG. 5. As shown in FIG. 5, output 32 of memory element 20 may be coupled to programmable transistor 36 (e.g., an NMOS or PMOS pass gate) using path 34. When programmable transistor 36 is provided with a positive Vgs value of 1.1 volts (or other suitable voltage level), an NMOS version of transistor 36 will turn on. When an NMOS transistor 36 is on, signals (e.g., data signals ranging between 0 volt logic low values and 1.1 volt logic high values or other suitable voltage levels) can pass between logic circuitry 60 (e.g., inverter 62 or other suitable circuitry) and logic circuitry (e.g., inverter 66 or other suitable circuitry). PMOS versions of transistor 36 may also be used in integrated circuit 10 if desired. Examples in which programmable transistors 36 are implemented using NMOS transistors are sometimes described as an example. This is, however, merely illustrative. In general, pass gate transistors 36 may be implemented using any suitable type of transistor (NMOS OR PMOS).

The gate insulator thickness TOX of transistor 36 is preferably relatively thin (e.g., about 12-14 angstroms) and the threshold voltage VT is relatively low (e.g., about 0 volts, lower than the threshold voltage VT of about 0.2 volts that may be used for the transistors elsewhere on integrated circuit 10). The relatively small thickness of the gate oxide and the low threshold voltage VT help ensure that transistor 36 can pass data signals from circuitry 60 to circuitry 64 without allowing the signals to become degraded.

Memory element 20 may contain a bistable data storage element such as bistable element 58. Bistable element 58 may be formed from cross-coupled inverters (as shown in the example of FIG. 5) or from other bistable circuits. Data may be stored on complementary data storage nodes N1 and N2. When the value on data storage node N1 is high (i.e., when N1 is storing a logic "1"), the value on data storage node N2 is low (i.e., data storage node N2 will be storing a logic "0") and vice versa. Output 32 may be coupled to data storage node N2 (as shown in FIG. 5) or may be coupled to data storage node N1. Following data loading, the data value on node N2 will be high or low. Output 32 may supply the high or low value to the gate G of transistor 36 via path 34.

Bistable element 58 may have a first inverter formed from p-channel metal-oxide-semiconductor (PMOS) transistor TP1 and n-channel metal-oxide-semiconductor (NMOS) transistor TN1. Bistable data storage element 58 may also have a second inverter formed from PMOS transistor TP2 and NMOS transistor TN2. Power may be supplied to bistable storage element 58 (and memory element 20) using a first power supply terminal that receives first power supply voltage such as a positive power supply voltage Vcc (e.g., 1.1 volts or other suitable positive voltage) and a second power supply terminal that receives a second power supply voltage such as a negative power supply voltage Vss (e.g., −0.2 volts or other suitable negative voltage). Transistors TP1 and TN1 may be coupled in series between Vcc and Vss. Transistors TP2 and TN2 may likewise be coupled in series between Vcc and Vss.

As shown in FIG. 5, the first inverter formed from transistors TP1 and TN1 is coupled in parallel with the second inverter formed from transistors TP2 and TN2. The input of the first inverter (node N1) is coupled to one of the source-drain terminals of address transistor TA. The other source-drain terminal of address transistor TA is coupled to data line D, so that transistor TA is coupled between data line D and node N1. The output of the first inverter is coupled to node N2, which is the input to the second inverter (i.e., the first and second inverters are cross coupled).

Data that is to be written into bistable element 58 may be received via data line D. The data on line D may be loaded into bistable element 58 (i.e., the value of the data on line D may be driven onto node N1) by using read-write control circuitry 24 to assert address signal ADD on the gate of address transistor TA (i.e., by taking the gate G of transistor TA to a logic high value). During normal operation, address signal ADD may be deasserted (e.g., held low), so that address transistor TA is held off. During read operations, data from node N1 may be read on line D by asserting address signal ADD and thereby turning on transistor TA.

Clear transistor TC may be used in clearing bistable element 58. During clear operations, control circuitry 24 may assert clear signal CLR, turning on clear transistor TC and driving the clear signal value on node 68 (e.g., a ground voltage) onto node N2 to clear bistable element 58.

Following loading of memory elements such as memory element 20 of FIG. 5, integrated circuit 10 may be operated normally in a system (sometimes referred to as "user mode" operations). During normal operation, each memory element 20 may supply a static output control signal to a respective programmable transistor 36. The value of the signal on line 34 and therefore the gate signal on gate G of transistor 36 will depend on the value of the data loaded into bistable element 58. If a logic "1" has been loaded onto node N2 (i.e., by driving a logic "0" onto node N1 via transistor TA), the voltage Vgs on transistor 36 will be Vcc (i.e., transistor 36 will be on). If a logic "0" has been loaded onto node N2 (i.e., by driving a logic "1" onto node N1 via transistor TA), the voltage Vgs on transistor 36 will be Vss (i.e., transistor 36 will be off).

The illustrative memory element of FIG. 5 has six transistors (TA, TC, TP1, TN1, TP2, and TN2). If desired, memory element 20 may be formed using other numbers of transistors (e.g., more than six transistors, seven transistors, more than seven transistors, eight transistors, more than eight transistors, etc.). An illustrative eight-transistor configuration that may be used for memory element 20 is shown in FIG. 6.

Figure 6:
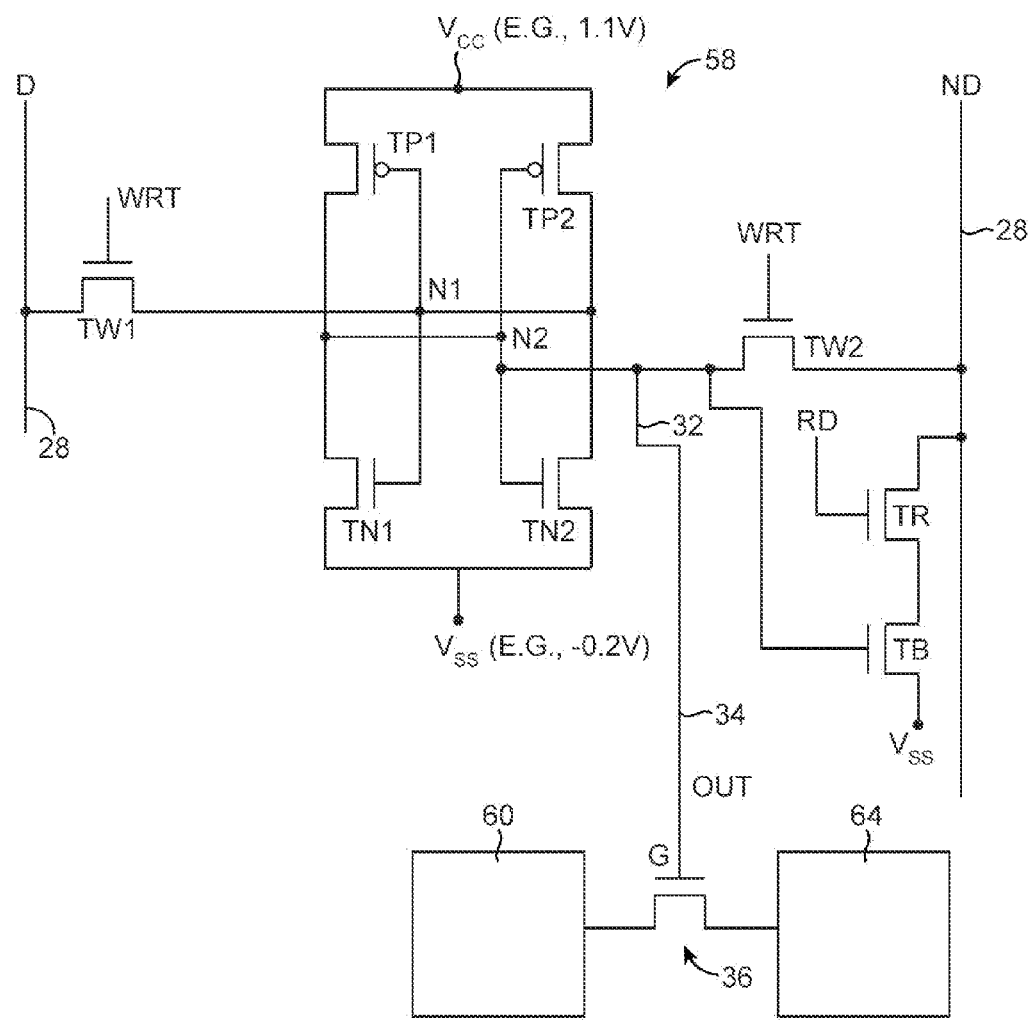
FIG. 6 is a circuit diagram of an illustrative random-access memory element based on an eight-transistor design and associated programmable circuitry including a pass gate transistor in accordance with an embodiment of the present invention.

As shown in FIG. 6, memory element 20 may have a bistable element 58 that is formed from cross-coupled inverters (i.e., transistors TP1, TN1, TP2, and TN2). Data line D and complementary data line ND may be used in writing data into bistable element 58 using differential write address transistors TW1 and TW2. When it is desired to write data into bistable element 58, data may be placed on data line D and a complementary version of the data may be placed on complementary data line ND. Write address signal WRT may then be asserted to load the data into bistable memory element 58. During normal operation, write address signal WRT may be deasserted and the data on node N2 may be used as an output that is applied to the gate G of transistor 36 via path 34.

Read buffer transistor TB and read address transistor TR may form a read circuit for reading data from node N2 via data line ND. When it is desired to read data from bistable element 58, read address signal RD can be asserted to turn on read transistor TR.

If desired, memory element 20 may be formed using a seven-transistor configuration (e.g., by omitting transistor TW2). Other configurations may be used for memory element 20 by increasing or decreasing the number of address transistors, by using differential and/or single ended write and read schemes, by using a read buffer circuit of the type shown in FIG. 6, etc.

The oxide thicknesses of the transistors in bistable memory element 58 of memory element 20 may be selected to enhance reliability. For example, the oxide thickness TOXM of transistors TP1, TN1, TP2, and TN2 may be thicker than the oxide thickness TOXT of programmable transistor 36. FIG. 7 is a table of illustrative oxide thicknesses that may be used for the transistors of memory element 20 and programmable transistor 36. As shown in FIG. 6, the transistors of bistable element 58 may have a gate oxide thickness of TOXM (e.g., 22 angstroms, 15-30 angstroms, 18 to 26 angstroms, 16 to 28 angstroms, etc.), programmable transistors 36 may have a gate oxide thickness TOXT (e.g., about 13 angstroms, 12 to 14 angstroms, 10-15 angstroms, etc.) that is less than TOXM (i.e., TOXM may be greater than TOXT), address transistors such as address transistor TA of FIG. 5, write address transistors TW1 and TW2 of FIG. 6, and read address transistor TR of FIG. 6 may have gate oxide thicknesses of TOXM or TOXT (i.e., their gate oxide thicknesses may be greater than or equal to TOXT), clear transistors such as clear transistor TC of FIG. 5 may have gate oxide thicknesses of TOXM or TOXT (i.e., their gate oxide thicknesses may be greater than or equal to TOXT), and read buffer transistors such as read buffer transistor TB of FIG. 6 may have a gate oxide thickness of TOXT (as examples).

The foregoing is merely illustrative of the principles of this invention and various modifications can be made by those skilled in the art without departing from the scope and spirit of the invention.

What is claimed is:

1. Circuitry, comprising:
   a memory element comprising an output and at least one transistor with a first gate insulator thickness; and
   a programmable transistor with a gate that is coupled to the output, wherein the programmable transistor has a second gate insulator thickness that is smaller than the first gate insulator thickness, wherein the programmable transistor comprises a pass gate.

2. The circuitry defined in claim 1 wherein the memory element has a positive power supply terminal that receives a positive power supply voltage and has a negative power supply terminal that receives a negative power supply voltage.

3. The circuitry defined in claim 2 wherein the memory element comprises a bistable data storage element having first and second nodes, wherein the second node is coupled to the output, and wherein the bistable data storage element is configured to be powered by the positive power supply voltage and the negative power supply voltage so that the programmable transistor is supplied with a negative gate-source voltage when turning off the programmable transistor.

4. The circuitry defined in claim 3 wherein the programmable transistor has a threshold voltage between 0.05 and −0.05 volts.

5. The circuitry defined in claim 4 wherein the memory element comprises a pair of cross-coupled inverters including four metal-oxide-semiconductor transistors at least one of which has a gate insulator of the first gate insulator thickness.

6. The circuitry defined in claim 5 further comprising at least one address transistor having a gate insulator of the second gate insulator thickness.

7. The circuitry defined in claim 5 further comprising at least one address transistor having a gate insulator of the first gate insulator thickness.

8. The circuitry defined in claim 1 wherein the programmable transistor has a threshold voltage of between 0.05 and −0.05 volts.

9. The circuitry defined in claim 1 wherein the memory element comprises a bistable data storage element having four transistors, at least one write address transistor, a read buffer transistor having a gate coupled to the second data storage node, and a read address transistor coupled between the read buffer transistor and a data line.

10. The circuitry defined in claim 9 wherein the write address transistor comprises one of a pair of write address transistors.

11. The circuitry defined in claim 1 wherein the programmable transistor comprises an n-channel metal-oxide-semiconductor transistor.

12. The circuitry defined in claim 1 wherein the programmable transistor comprises a p-channel metal oxide semiconductor transistor.

13. The circuitry defined in claim 1 wherein the negative voltage comprises a voltage between −0.15 and −0.25 volts.

14. A programmable integrated circuit, comprising:
a programmable transistor having a gate terminal, a first source-drain terminal, a second source-drain terminal, and having a first gate insulator thickness;
at least one memory element operable to be loaded with a configuration data and configured to supply a static output control signal corresponding to the loaded configuration data to the gate terminal of the programmable transistor, wherein the memory element has a bistable storage element with transistors that have a second gate insulator thickness that is greater than the first gate insulator thickness;
a first logic circuit coupled to the first source-drain terminal of the programmable transistor; and
a second logic circuit coupled to the second source-drain terminal of the programmable transistor.

15. The programmable integrated circuit defined in claim 14 wherein the memory element has a positive power supply terminal that is configured to receive a positive power supply voltage and has a negative power supply terminal that is configured to receive a negative power supply voltage.

16. The programmable integrated circuit defined in claim 15 wherein the bistable storage element has first and second nodes, wherein the second node is coupled to the output, and wherein the bistable storage element is configured to be powered by the positive power supply voltage and the negative power supply voltage so that the programmable transistor is supplied with a negative gate-source voltage when turning off the programmable transistor.

17. The circuitry defined in claim 16 wherein the programmable transistor has a threshold voltage of less than 100 mV.

18. The circuitry defined in claim 14 wherein the transistors in the bistable storage element comprise four metal-oxide-semiconductor transistors configured to form a pair of cross-coupled inverters.

19. The circuitry defined in claim 18 wherein the memory element further comprises at least one address transistor having a gate insulator of the second gate insulator thickness.

20. A programmable integrated circuit, comprising:
an array of random-access memory cells configured to output a static control signal on a respective output path, wherein the static control signal on each path is a selected one of a positive static control signal and a negative static control signal; and
a plurality of corresponding programmable transistors, each programmable transistor having a gate that is configured to receive the static control signal from a respective one of the output paths, wherein the programmable transistors have gate insulators that are thinner than at least some transistors in the configuration random-access memory cells, wherein the static control signals configure the plurality of programmable transistors to collectively perform at least one logic function.

21. The programmable integrated circuit defined in claim 20 wherein the programmable transistors comprise n-channel metal-oxide semiconductor transistors having threshold voltages between −100 mV and 100 mV.

* * * * *